United States Patent
Rahimo et al.

(10) Patent No.: US 7,816,706 B2
(45) Date of Patent: Oct. 19, 2010

(54) POWER SEMICONDUCTOR DEVICE

(75) Inventors: Munaf Rahimo, Uezwil (CH); Peter Streit, Widen (CH)

(73) Assignee: ABB Technology AG, Zurich (CH)

( * ) Notice: Subject to any disclaimer, the term of this patent is extended or adjusted under 35 U.S.C. 154(b) by 265 days.

(21) Appl. No.: 12/007,890

(22) Filed: Jan. 16, 2008

(65) Prior Publication Data

US 2008/0164490 A1 Jul. 10, 2008

Related U.S. Application Data

(63) Continuation of application No. PCT/CH2006/000374, filed on Jul. 18, 2006.

(30) Foreign Application Priority Data

Jul. 22, 2005 (EP) .................................. 05405450

(51) Int. Cl.
*H01L 29/745* (2006.01)
*H01L 21/332* (2006.01)

(52) U.S. Cl. ........................ 257/147; 257/104; 257/146; 257/153; 257/170; 257/E21.388; 257/E29.211; 257/E29.213; 438/133; 438/350; 438/530

(58) Field of Classification Search ................. 257/104, 257/146, 153, 170, E21.388, E29.211, E29.213; 438/133, 350, 530
See application file for complete search history.

(56) References Cited

U.S. PATENT DOCUMENTS

| 3,513,367 A | 5/1970 | Wolley |
| 3,697,827 A | 10/1972 | Simon |
| 4,170,502 A | 10/1979 | Watakabe |
| 4,243,999 A | 1/1981 | Azuma et al. |

(Continued)

FOREIGN PATENT DOCUMENTS

CA         1 135 875         11/1982

(Continued)

OTHER PUBLICATIONS

High-Tech Report, "Bulk GTO Thyrister Accommodates 9,000V/1,000A" 2209 JEE—Journal of Electronic Engineering, Dec. 24, 1987, No. 252, Tokyo, Japan, pp. 62-63.

(Continued)

*Primary Examiner*—Dao H Nguyen
(74) *Attorney, Agent, or Firm*—Buchanan Ingersoll & Rooney PC

(57) ABSTRACT

The power semiconductor device with a four-layer npnp structure can be turned-off via a gate electrode. The first base layer comprises a cathode base region adjacent to the cathode region and a gate base region adjacent to the gate electrode, but disposed at a distance from the cathode region. The gate base region has the same nominal doping density as the cathode base region in at least one first depth, the first depth being given as a perpendicular distance from the side of the cathode region, which is opposite the cathode metallization. The gate base region has a higher doping density than the cathode base region and/or the gate base region has a greater depth than the cathode base region in order to modulate the field in blocking state and to defocus generated holes from the cathode when driven into dynamic avalanche.

21 Claims, 2 Drawing Sheets

U.S. PATENT DOCUMENTS

| | | | |
|---|---|---|---|
| 7,531,888 B2* | 5/2009 | Cai | 257/556 |
| 2007/0001176 A1* | 1/2007 | Ward et al. | 257/77 |
| 2008/0012042 A1* | 1/2008 | Sugawara | 257/147 |

FOREIGN PATENT DOCUMENTS

| | | |
|---|---|---|
| EP | 0 588 026 A2 | 3/1994 |
| JP | 55-123165 | 9/1980 |
| JP | 61-15367 A | 1/1986 |

OTHER PUBLICATIONS

Harald Gunther Kuhn, "Physikalische Modellbildung von IGCTs für die Schaltungssimulation" 2002, pp. 1-19.

International Search Report dated Sep. 21, 2006.

English translation of Office Action dated Mar. 27, 2009 issued in corresponding Chinese Patent Application No. 200680026776.4.

* cited by examiner

POWER SEMICONDUCTOR DEVICE

RELATED APPLICATIONS

This application claims priority under 35 U.S.C. §119 to EP Application 05405450.7 filed in Europe on Jul. 22, 2005, and as a continuation application under 35 U.S.C. §120 to PCT/CH2006/000374 filed as an International Application on Jul. 18, 2006 designating the U.S., the entire contents of which are hereby incorporated by reference in their entireties.

TECHNICAL FIELD

The invention relates to the field of power semiconductor devices. A four-layer power semiconductor device and a method for the manufacturing of such a semiconductor device are disclosed.

BACKGROUND INFORMATION

The document EP 0 588 026 A2 and the thesis entitled "Physikalische Modellbildung von IGCTs für die Schaltungssimulation", chapter 3 by H. G. Kuhn, Munich, 2002 describe gate turn-off thyristors (GTO) and integrated gate commutated thyristors (IGCT). Such thyristors comprise a four-layer pnpn structure comprising an (n+) doped cathode layer, on which a cathode metallization is arranged, adjacent to a p doped base layer, which is contacted by a gate electrode, followed by an (n−) doped base layer and a (p+) doped anode layer. The anode layer is covered by an anode metallization. When such a GTO or IGCT is switched-off, holes are collected efficiently laterally within the (p−) base layer to the gate. The holes reaching the (n+) cathode region may retrigger the thyristor preventing the semiconductor to switch off. Thereby, the maximum turn-off current is reduced.

The GTO is normally used in snubbered operation, the snubber limiting voltage rise. In this mode of operation all the holes that can reach the cathode and retrigger the device are from stored charge. There distribution is widely determined by the on-state preceding turn-off.

In most IGCT applications snubberless operation is rule, and voltage rise is often only limited by the turn-off device itself. Thereby, the field distribution gets steep enough to generate new carrier pairs during turn-off. This mode is called dynamic avalanche. If an IGCT is driven into this mode, holes generated at turn-off may also reach the cathode, retriggering the device and thereby limiting maximum turn-off current.

A power semiconductor device according to the prior art also comprises a semiconductor device of the above structure, but with a first base layer of modulated conductivity. Such a device is e.g. described in U.S. Pat. No. 4,170,502. In this embodiment the on-state takes advantage of the lower first base layer doping concentration, whereas turn-off is favored by the lower lateral resistance of said layer towards the gate. What is instrumental in improving this type of GTO thyristor is the maximum concentration of said first base layer, which is lower adjacent to the cathode emitter and higher towards the gate contact.

SUMMARY

A four-layer power semiconductor device of the initially mentioned kind with an increased maximum turn-off current which is producable by an easy manufacturing method avoiding delicate manufacturing steps and A method for manufacturing such a semiconductor device are disclosed.

A power semiconductor device is disclosed with a semiconductor substrate and a cathode metallization being formed on a cathode side and an anode metallization being formed on an anode side opposite the cathode side. Such an exemplary semiconductor substrate comprises a four-layer structure with layers of different conductivity types, said four-layer structure defining an inner structure of a thyristor, which can be turned-off via a gate electrode. The four-layer structure comprises an outer cathode region of a first conductivity type contacting the cathode metallization, a first base layer of the second conductivity type contacting the cathode region on a side opposite the cathode metallization, a second base layer of the first conductivity type contacting the first base layer on a side opposite the outer cathode region, and an outer anode layer of second conductivity type contacting the anode metallization, said gate electrode being arranged on the cathode side and electrically contacting said first base layer. The first base layer comprises a cathode base region and at least one gate baseregion, said cathode base region being arranged adjacent to the cathode region on the side opposite the cathode metallization and contacting at least a central area of the cathode region, said at least one gate base region being disposed adjacent to the second base layer and bordering on the cathode base region. Said at least one gate base region has the same nominal doping density as the cathode base region in at least one first depth, the first depth being given as a perpendicular distance from the side of the cathode region, which is opposite the cathode metallization. Said at least one gate base region electrically contacts the gate electrode, and has at least one of the following features:

a higher doping density than the cathode base region in at least one second depth, the second depth being greater than said first depth or a greater depth than the cathode base region.

A method for manufacturing a semiconductor device is disclosed with a semiconductor substrate and a cathode metallization being formed on a cathode side and an anode metallization being formed on an anode side opposite the cathode side, the method comprising the following steps:

on a substrate of first conductivity type a continuous layer is produced with a first dopant of the second conductivity type on the cathode side, a structured layer is produced on the cathode side with a second dopant of the second conductivity type, the first dopant is diffused into the substrate forming a continuous layer, the second dopant is diffused into the substrate, whereby the region, in which the second dopant is diffused, forms the at least one gate base region in the finalized semiconductor device and the region, in which no second dopant is diffused in the finalized semiconductor device forms the cathode base region, the cathode base region and the gate base region having the same nominal doping density in at least one first depth, and at least one of the following steps are taken:

the second dopant is driven into the substrate in such a way that the doping density within the gate base region is higher than within the cathode base region in at least one second depth or the second dopant is driven into the substrate up to a greater depth than the first dopant, to produce the cathode, the segmented structure on the cathode side, the gate electrode, the cathode metallization, the anode layer and the anode metallization.

BRIEF DESCRIPTION OF THE DRAWINGS

The subject matter of the disclosure will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
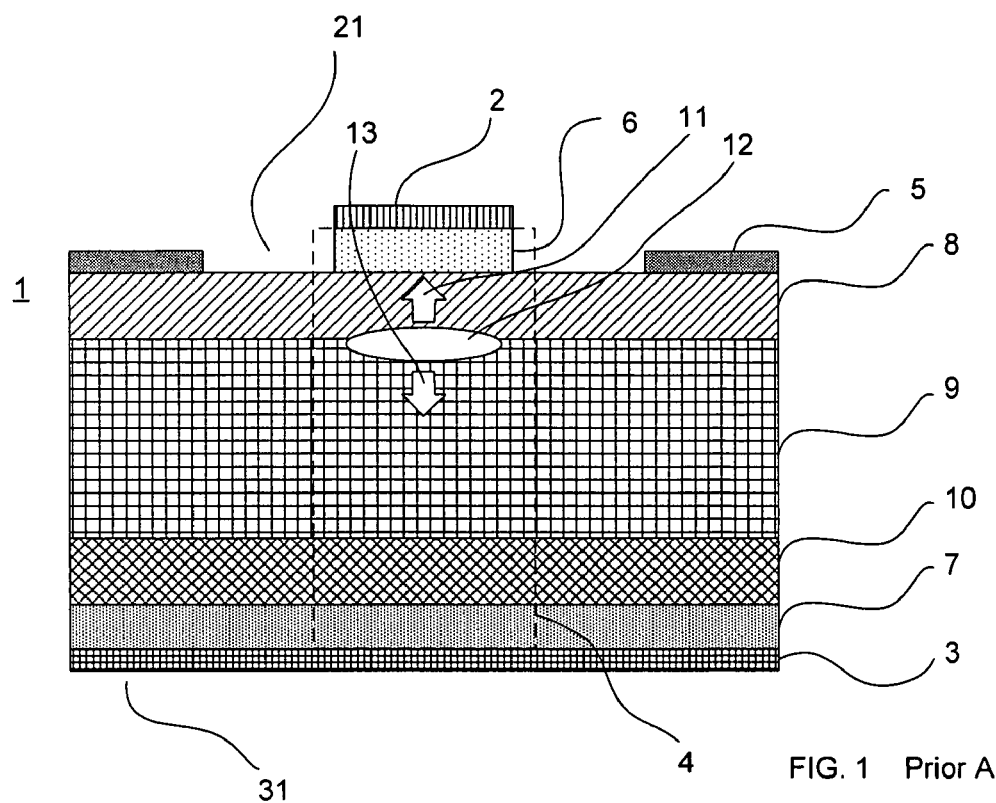
FIG. 1 shows an integrated gate commutated thyristor according to the prior art.

The new modulation of the main blocking junction described therein influences the field distribution at high turn-off current such, that during dynamic avalanche the generated holes are located far enough from the cathode and close enough to the gate to not retrigger the device.

A power semiconductor device according to the prior art comprises a semiconductor substrate and a cathode metallization, which is formed on a cathode side, and an anode metallization, which is formed on an anode side opposite the cathode side. The semiconductor substrate of such a semiconductor device comprises a four-layer structure with layers of different conductivity types, which structure defines an inner structure of a gate-commutated thyristor, which can be turned-off via a gate electrode. Said structure comprises an outer cathode region of a first conductivity type contacting the cathode metallization, a first base layer of the second conductivity type contacting the cathode region on a side opposite the cathode metallization, a second base layer of the first conductivity type contacting the first base layer on a side opposite the outer cathode region, and an outer anode layer of second conductivity type contacting the anode metallization.

The gate electrode is arranged on the cathode side and contacts the first base layer.

Further to the features of a semiconductor device according to the prior art as described above, the inventive power semiconductor device comprises the first base layer with a cathode base region and at least one gate base region. The cathode base region is arranged adjacent to the cathode region on the side opposite the cathode metallization and contacts at least a central area of the cathode region. The at least one gate base region is disposed adjacent to the second base layer and borders on the cathode base region. The at least one gate base region has the same nominal doping density as the cathode base region in at least one first depth, the first depth being given as a perpendicular distance from the side of the cathode region, which is opposite the cathode metallization. The at least one gate base region electrically contacts the gate electrode and it has at least one of the following features:

a higher doping density than the cathode base region in at least one second depth, the second depth being greater than said first depth or a greater depth than the cathode base region.

These special features of the at least one gate base region are such, that they strongly modulate the electric field distribution in the device in its forward blocking state and lead to field maxima close to the interface between the cathode base region and the gate base region.

If the semiconductor device is turned-off, holes flow from the second base layer through the gate base region to the gate electrode. In the case of an IGCT, this commutation of the hole current to the gate is very fast and completed before the anode voltage starts increasing. Therefore, the semiconductor device cannot unintentionally be retriggered by holes originating from stored charge and is, therefore, not prevented to turn-off. If blocking voltage, however, increases very fast, the regions where the main junction starts to be driven into dynamic avalanche will be close to the field maxima and therefore remote from the cathode. Therefore, most of the holes generated by the avalanche will flow directly to the gate electrode.

The big advantage of the inventive power semiconductor device is the fact that it is capable of being driven in dynamic avalanche much stronger and longer than a device according to prior art before generated holes can reach the cathode and accidentally retrigger. Therefore the inventive device is capable to turn-off considerably more current at high voltage than the prior art device.

As the device turns off, forward voltage drop opens up a space charge region on both sides of the main blocking junction between first and second base layer. This space charge region is formed when the mobile charge carriers have been totally or at least for the most part removed, therefore leaving behind fixed charges of opposite sign in the first and second base layers.

By laterally structuring the first base layer into the cathode base region and hole attraction region, and by having different doping density profiles, the space charge region resulting will itself be modulated, and the onset of avalanche multiplication, both with or without mobile charges remaining, will be locally concentrated to high field regions situated along the changeover between the cathode base region and hole attraction region, and effectively kept away from the cathode base region having lower depth and/or doping density.

From the above description it is perceptible that the advantage of the present invention is obtained when the doping density profiles in the cathode base region and gate base region differ in depth or doping density in those depths that will be part of the space charge region during turnoff. Their difference has to be large enough to effectively influence the onset of dynamic avalanche at turn-off, on the other hand, the changeover region has to remain smooth enough not to loose appreciable blocking capability of the device.

During on-state of the semiconductor device, the at least one gate base region will not have a negative effect on the on-state characteristics, because the at least one gate base region is essentially disposed outside the region between the central area of the cathode and the anode metallization. And during turn-on of the semiconductor device, the at least one gate base region will lead to an only moderately higher turn-on gate current, since most of the carriers injected by the cathode will reach the second base layer without passing through said at least one gate base region.

FIG. 1 shows a power semiconductor device 1 according to the prior art with a semiconductor substrate 4 and a cathode metallization 2 being formed on a cathode side 21 and an anode metallization 3 being formed on an anode side 31 opposite the cathode side 21. The semiconductor substrate 4 comprises a four-layer pnpn structure with layers of different conductivity types. The structure defines an inner structure of a gate-commutated thyristor, which can be turned-off via a gate electrode 5. The structure comprises the following layers:

- an outer (n+) doped cathode region 6 contacting the cathode metallization 2,
- a first base layer 8 with p impurities contacting the cathode region 6 on the side opposite the cathode metallization 2,
- a second (n−) dopedbase layer 9 contacting the first base layer 8 on the side opposite the cathode region 6,
- an n doped buffer layer 10 contacting the second base layer 9 on the side opposite the first base layer 8, and
- an outer p doped anode layer 7 of second conductivity type contacting the anode metallization 3.

The gate electrode 5 is arranged on the cathode side 21 of the substrate and electrically contacts the first base layer 8.

At hard switching, as it is the case for IGCTs, the area at which the dynamic avalanche sets in is shown in FIG. 1 by the ellipse 12. The arrow 11 shows the path of the generated holes and the arrow 13 shows the path of the generated electrons. The generation of holes takes place in an area below the cathode region 6 where the current density is highest. Therefore, the holes can retrigger the device, if they reach the cathode region 6.

Figure 2:
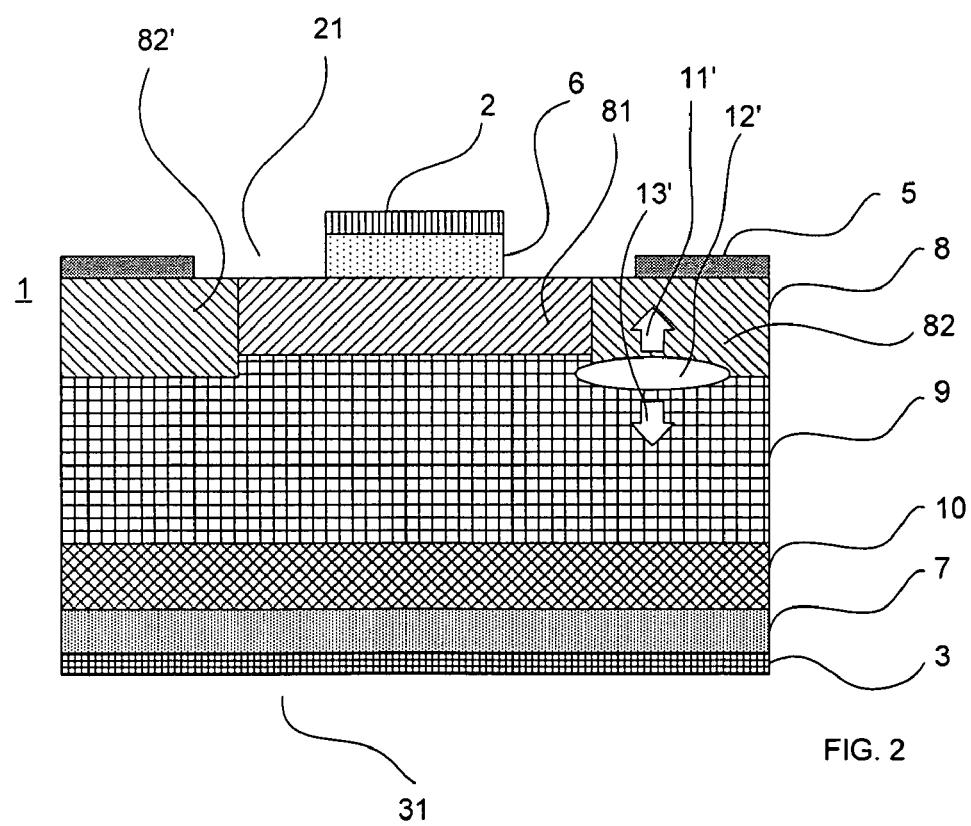
FIG. 2 shows a first embodiment of the integrated gate commutated thyristor device according to the disclosure.

FIG. 2 shows an inventive power semiconductor device with a four-layer structure like the semiconductor device 1 shown in FIG. 1. In the semiconductor device shown in FIG. 2 the first base layer 8 is split up into at least one cathode base region 81, which is disposed adjacent to the cathode region 6 on the side opposite the cathode metallization 2, and contacts the cathode region 6, and two gate base regions 82, 82', which are disposed adjacent to the second base layer 9, and which border on the cathode base region 81, so that the gate base regions 82, 82' do not directly contact the cathode region 6. The at least one gate base region 82, 82' has the same nominal doping density as the cathode base region 81 in at least one first depth, the first depth being given as a perpendicular distance from the side of the cathode region 6, which is opposite the cathode metallization 2. The gate base regions 82, 82' electrically contact the gate electrode 5. The gate base regions 82, 82' have at least one of the following features:

- a higher doping density than the cathode base region 81 in at least one second depth, the second depth being greater than said first depth or
- a greater depth than the cathode base region 81.

The same nominal doping density of the at least one gate base region 82, 82' and cathode base region 81 means that these doping densities are the same in accordance with engineering specification, but fluctuations due to the manufacturing process can occur and are allowable. The same nominal doping density includes of course the case that the doping density of the at least one gate base region 82, 82' and cathode base region 81 are the same in the at least one first depth.

In an exemplary embodiment of the inventive semiconductor device, the doping density of the gate base regions 82, 82' is at least twice as high, preferably at least five times as high as the doping density of the cathode base region 81 in at least one second depth influencing the field distribution in the blocking state.

In another exemplary embodiment of the inventive semiconductor device, the depth of the gate base regions 82, 82' is at least 5 μm deeper than the depth of the cathode base region 81, in particular 20 μm. Preferably, the depth of the gate base regions 82, 82' is at maximum 50 μm deeper than the depth of the cathode base region 81. This will in all cases influence the field distribution in the blocking state.

The gate base regions 82, 82' can be disposed symmetrically on both sides adjacent to the cathode region 6 without having an overlapping area with the cathode region 6. In this case, the cathode base region 81 is electrically contacting the cathode region 6 over the whole side of the cathode region 6 opposite the cathode metallization 2.

In an exemplary embodiment, the (n+) doped cathode region 6 has a doping density higher than $10^{18}/cm^3$ and/or a depth in the range of 5 μm up to 40 μm.

The (n−) doped second base layer 9 has a doping density in the range of $10^{11}/cm^3$ up to $3*10^{14}/cm^3$, and/or a depth in the range of 50 μm up to 1500 μm.

The n doped buffer layer 10 has a doping density in the range of $10^{15}/cm^3$ up to $5*10^{17}/cm^3$, and/or a depth in the range of 10 μm up to 100 μm, or it can be completely omitted if the semiconductor is not of punch-through type. The p doped anode layer 7 can have a doping density of $10^{16}/cm^3$ up to $10^{19}/cm^3$, and/or a depth in the range of 1 μm up to 50 μm, a thin depth belonging to a transparent anode, and a thick depth to a diffused anode. The anode can also be shorted, having regions where the second base layer and the buffer layer are directly connected to the anode side metal, or it can cover the complete anode side and allow for reverse blocking. It depends on the intended purpose of the semiconductor device 1 what kind of anode is used.

In a further exemplary embodiment, the p doped cathode base region 81 has a maximum doping density in the range of $5*10^{15}/cm^3$ up to $5*10^{18}/cm^3$, and/or a depth in the range of 2 μm up to 200 μm, in particular the depth is about or exactly 120 μm.

In another exemplary embodiment the (p+) doped gate base regions 82, 82' have a maximum doping density in the range of $5*10^{15}/cm^3$ up to $5*10^{18}/cm^3$ and/or a depth in the range of 2 μm up to 200 μm, in particular, the depth of the hole attraction regions 82, 82' is about or exactly 150 μm.

In another exemplary embodiment, the gate base regions 82, 82' have a doping density in a depth close to the junction between the gate base region 82, 82' and the second base layer 9, which is higher than the doping density of the cathode base region 81 in a depth close to the junction between the cathode base region 81 and the second base layer 9. The gate base regions 82, 82' close to the (n−) second base layer 9 become part of a space charge region if the voltage difference between the anode layer 7 and the cathode region 6 increases during turn-off of the semiconductor device.

Differently from the switching of a prior art semiconductor device 1 as shown in FIG. 1, where the generation of holes takes place in an area below the cathode, in FIG. 2 the area at which the dynamic avalanche sets in at hard switching (indicated in FIG. 2 by the ellipse 12') is shifted towards the gate electrode 5. Generated holes can easily reach the gate electrode (shown in FIG. 2 by the arrow 11'), thereby avoiding a retriggering of the device. The path for the generated electrons is shown by the arrow 13'.

Figure 3:
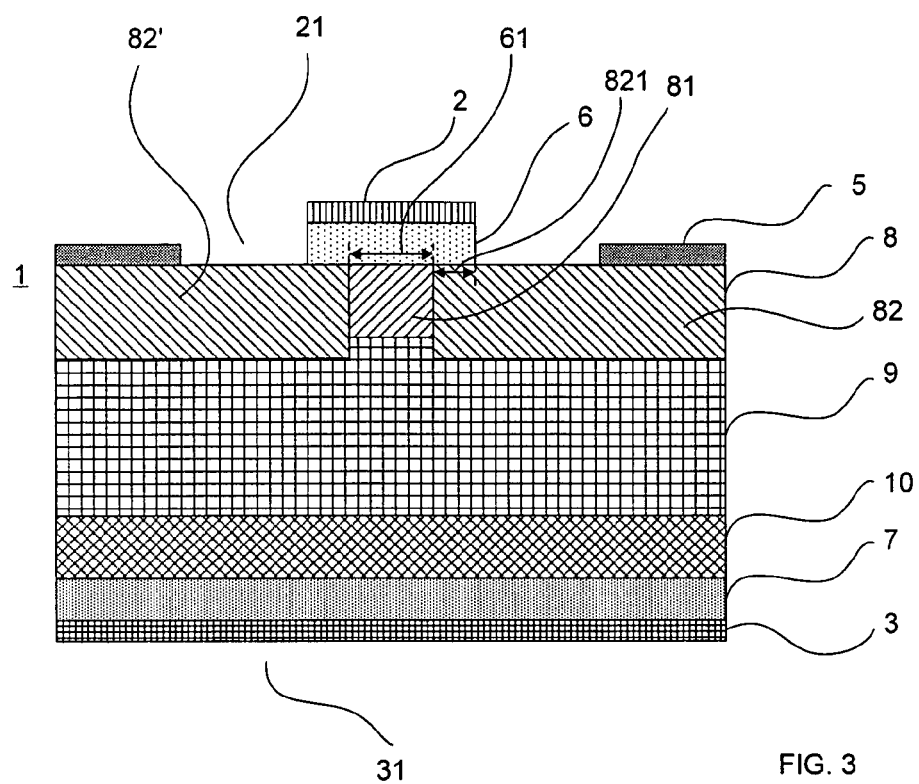
FIG. 3 shows a further exemplary embodiment of the integrated gate commutated thyristor device according to the disclosure.

In FIG. 3, another exemplary embodiment of the inventive semiconductor device is shown. In FIG. 3, the cathode base region 81 contacts the cathode region 6 only in a central area 61 of the cathode region. The gate base regions 82, 82' have an overlapping area 821 with the cathode region 6, so that the gate base regions 82, 82' directly contact the cathode region 6. The gate base regions 82, 82' border on the cathode base region 81. The central area 61 of the cathode region is at least twice as large as the overlapping area 821, ensuring a good electrical contact between the cathode base region 81 and the cathode region 6. In a further exemplary embodiment, the central area 61 of the cathode region is at least eight times larger than the overlapping area 821. The lateral structure of the first base layer 8 is especially effective in improving maximum turnoff capability, if the transition between the cathode base region 81 and the at least one gate base region 82, 82' are within the part of the device where cathode current has been flowing at a high density. Therefore, depending on the device design, a certain protrusion of the gate base region 82, 82' underneath the cathode region 6 can be advantageous.

The gate base regions 82, 82' and/or the cathode base region 81 can comprise a first deep profile with a lower doping density and a shallower profile with a higher doping density in order to achieve a desired gradient of the doping density.

The disclosure can be applied to all kind of four-layer power semiconductor devices which can be turned-off, especially to gate turn-off thyristors (GTOs), gate commutated thyristors (GCTs) and to integrated gate commutated thyristors (IGCTs). IGCTs normally comprise a buffer layer 10 as shown in FIGS. 1 and 2, but the invention can also be applied to devices without such a buffer layer 10. For devices without a buffer layer 10, the anode layer 7 extends to a depth in the range of 20 μm up to 150 μm and may be designed for reverse blocking.

Furthermore, it is also possible to apply the disclosure to four-layer npnp semiconductors with p type second base layers, in which case the conductivity types of all layers are reversed.

Though the inventive semiconductor device according to FIGS. 2 and 3 show a device with two gate base regions 82, 82', an inventive semiconductor device can comprise only one gate base region 82 or more than two gate base regions 82. In case of more gate base regions (82, 82') they may form one laterally interconnected region surrounding all the cathode base regions (81) placed below the segmented cathode metallization (2).

A method of manufacturing a semiconductor device of the inventive kind will differ from a prior art device already at an early stage of wafer manufacturing, since the semiconductor junction with the largest diffusion depth has to be formed at the early stages of the device fabrication process. The desired diffusion profile is typically obtained by methods that are state of the art, such as implantation and/or pre-deposition of the dopants, followed by drive-in at high temperature. The implantation and/or pre-deposition for the doping regions with the deepest junction, i.e. the gate base regions 82, 82' has to be arranged in a way that the doping material is only diffusing from regions of the surface that will finally become gate base regions 82, 82', whereas regions that will become cathode base regions 81 are no dopant sources for this diffusion. Since the gate base regions 82, 82' should be designed in a way to modulate the junction profile in considerable depth, typically between 50 and 200 μm (micrometers), it is advantageous to use a doping species with a fast diffusion rate. If this fast diffuser is combined with a slow diffuser, a double profile can be made without necessarily having to drive the dopant forming the gate base regions 82, 82' much longer than the homogenously deposited slower dopant. Therefore, various manufacturing methods are possible.

In the following a manufacturing method for the manufacturing of an inventive semiconductor device is explained. Aluminium from ion implantation may be used as a fast diffuser and Boron as a slow diffuser. On a wafer (usually (n−) doped), comprising a cathode side 21 and an anode side 31 opposite the cathode side 21, Boron is implanted homogenously on the cathode side 21 and diffused in a first diffusion, in which an oxide is grown. This oxide is structured by photolithography, leaving the oxide only in those areas which later form the cathode region 6 and etching it otherwise. For forming the first base layer 8, Aluminium is implanted, whereby the Aluminium reaches the silicon in the oxide-free areas and stays in the oxide otherwise. After the oxide is then etched off completely, the Aluminium source for a consecutive second diffusion is limited to the gate base regions 82, 82'.

For the further manufacturing process, a second, homogeneous Aluminium implant is made on the cathode side 21. Furthermore, for the manufacturing of punch-through design devices a homogeneous Phosphorus implant is then made on the anode side 31, by which step a buffer layer 10 is formed. Afterwards, drive-in of all implanted and pre-deposited dopants is carried out at high temperature. After these process steps, the Aluminium of both implants has reached greater depths than the Boron implanted first. By this process, on the cathode side 21 a cathode base region 81 is formed with an Aluminium-Boron double profile with lesser depth than the gate base regions 82, 82' with an Aluminium-Aluminium-Boron triple profile with larger depth.

The steps following the manufacturing of the first base layer 8, comprising the cathode base region 81 and the gate base region 82, 82', are state of the art. On the cathode side 21, Phosphorus pre-deposition for the cathode region 6 formation, accompanied eventually by Phosphorus short pre-deposition on the anode side 31 will follow, then segmentation etch on the cathode region 6 and finally anode emitter implant follows for forming the anode layer 7 with intercalated diffusions corresponding to the detailed design. Finally, contact metallization for the cathode, anode and gate metallizations 2, 3, 5 and junction passivation lead to the finished pellet, and carrier lifetime engineering, encapsulation and mounting of the gate unit to the ready to use IGCT device.

Other manufacturing methods for the manufacturing of an inventive semiconductor device are also possible. E.g. Gallium can be substituted for Aluminium as a fast dopant together with Boron, or Gallium can be substituted for Boron as a slow dopant together with Aluminium. Alternatively, the modulated first base layer 8 can be realized as a double Gallium profile. In another alternative, the structured Aluminium profile is made first, followed by Boron and the second Aluminium. In a further alternative, no second, homogeneous Aluminium implant is made. An inventive semiconductor device produced by such a method comprises a first base layer 8 made from a double or multiple profile with the part of the profile with the largest depth being formed in a way described above.

The process step directly leading to the structured pre-deposition of the patterned diffusion can also be realized by alternative methods that are state of the art. Instead of using a patterned oxide layer thick enough to prevent implanted Aluminium to reach the silicon, the same can be obtained by implanting with a patterned photoresist layer of suitable quality. Or it is possible to pre-deposit Aluminium by a vacuum diffusion process and use a patterned layer that will act as a diffusion barrier, as e.g. Silicon Nitride. Or it is even possible to pre-deposit Aluminium homogenously over the whole cathode side 21 in a thin layer by implantation or vacuum diffusion, and then to selectively remove this layer by locally etching the silicon surface. All of these techniques result in a patterned pre-deposition of a diffusion source that can be diffused in consecutive diffusion processes thereby resulting in a modulated junction between first base layer 8 and the second base layer 9.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS 1 semiconductor device
2 cathode metallization
21 cathode side
3 anode metallization
31 anode side
4 semiconductor substrate
5 gate electrode
6 cathode region
61 central area of the cathode region
7 anode layer
8 first base layer
81 cathode base region
82, 82' gate base region
821 overlapping area
9 second base layer
10 buffer layer
11, 11' Path for holes
12, 12' Area, in which dynamic avalanche sets in
13, 13' Path for electrons

What is claimed is:

1. Power semiconductor device with a semiconductor substrate and a cathode metallization being formed on a cathode side and an anode metallization being formed on an anode side opposite the cathode side,
said semiconductor substrate comprising a four-layer structure with layers of different conductivity types,
said four-layer structure defining an inner structure of a thyristor, which can be turned-off via a gate electrode, and
said four-layer structure comprising
an outer cathode region of a first conductivity type contacting the cathode metallization,
a first base layer of the second conductivity type contacting the cathode region on a side opposite the cathode metallization,
a second base layer of the first conductivity type contacting the first base layer on a side opposite the outer cathode region, and
an outer anode layer of second conductivity type contacting the anode metallization,
said gate electrode being arranged on the cathode side and electrically contacting said first base layer,
the first base layer comprising a cathode base region and at least one gate base region,
said cathode base region being arranged adjacent to the cathode region on the side opposite the cathode metallization and contacting at least a central area of the cathode region,
said at least one gate base region being disposed adjacent to the second base layer and bordering on the cathode base region,
said at least one gate base region having the same nominal doping density as the cathode base region in at least one first depth, the first depth being given as a perpendicular distance from the side of the cathode region, which is opposite the cathode metallization,
said at least one gate base region electrically contacting the gate electrode, and said at least one gate base region having at least one of the following features:
a higher doping density than the cathode base region in at least one second depth, the second depth being greater than said first depth, and
a greater depth than the cathode base region.

2. Semiconductor device according to claim 1, wherein the doping density of the gate base region is at least twice as high as the doping density of the cathode base region in the at least one second depth.

3. Semiconductor device according to claim 2, wherein the depth of the at least one gate base region is at least 5 μm deeper than the depth of the cathode base region.

4. Semiconductor device according to claim 1, wherein the depth of the at least one gate base region is at least 5 μm deeper than the depth of the cathode base region.

5. Semiconductor device according to claim 4, wherein the depth of the at least one gate base region is at maximum 50 μm deeper than the depth of the cathode base region.

6. Semiconductor device according to claim 5, wherein the at least one gate base region has a doping density in a depth close to the junction between the gate base region and the second base layer higher than the doping density of cathode base region in a depth close to the junction between the cathode base region and the second base layer.

7. According to claim 1, wherein the at least one gate base region has a doping density in a depth close to the junction between the gate base region and the second base layer higher than the doping density of cathode base region in a depth close to the junction between the cathode base region and the second base layer.

8. Semiconductor device according to claim 7, wherein the at least one gate base region has an overlapping area with the cathode region and the central area of the cathode region is at least twice as large as the overlapping area.

9. Semiconductor device according to claim 7, wherein the cathode base region is contacting the cathode region over the whole side of the cathode region opposite the cathode metallization and the at least one gate base region is disposed adjacent to the cathode region.

10. Semiconductor device according to claim 1, wherein the at least one gate base region has an overlapping area with the cathode region and the central area of the cathode region is at least twice as large as the overlapping area.

11. Semiconductor device according to claim 10, wherein the semiconductor device comprises at least two gate base regions which are arranged to both sides of the cathode base region symmetrically to the central area of the cathode region.

12. Semiconductor device according to claim 1, wherein the semiconductor device comprises at least two gate base regions which are arranged to both sides of the cathode base region symmetrically to the central area of the cathode region.

13. Semiconductor device according to claim 1, wherein the cathode base region is contacting the cathode region over the whole side of the cathode region opposite the cathode metallization and the at least one gate base region is disposed adjacent to the cathode region.

14. Semiconductor device according to claim 13, wherein the semiconductor device comprises a buffer layer of the first conductivity type with a higher doping density than the second base layer which is arranged between the second base layer on a side opposite the first base layer and the anode layer.

15. Semiconductor device according to claim 1, wherein the semiconductor device comprises a buffer layer of the first conductivity type with a higher doping density than the second base layer which is arranged between the second base layer on a side opposite the first base layer and the anode layer.

16. Semiconductor device according to claim 15, wherein the semiconductor device is an Integrated Gate Commutated Thyristor.

17. Semiconductor device according to claim 1, wherein the semiconductor device is an Integrated Gate Commutated Thyristor.

18. Semiconductor device according to claim 17, wherein the cathode base region has a thickness in the range of 20 μm to 200 μm, and/or a maximum doping density in the range of $5*10^{15}/cm^3$ to $5*10^{18}/cm^3$.

19. Semiconductor device according to claim 1, wherein the cathode base region has a thickness in the range of 20 μm to 200 μm and/or a maximum doping density in the range of $5*10^{15}/cm^3$ to $5*10^{18}/cm^3$.

20. Semiconductor device according to claim 19, wherein the gate base region has a thickness in the range of 20 μm to 200 μm and/or a maximum doping density in the range of $5*10^{15}/cm^3$ to $5*10^{18}/cm^3$.

21. Semiconductor device according to claim 1, wherein the gate base region has a thickness in the range of 20 μm to 200 μm and/or a maximum doping density in the range of $5*10^{15}/cm^3$ to $5*10^{18}/cm^3$.

* * * * *